United States Patent
Gerna et al.

(10) Patent No.: US 10,205,378 B2
(45) Date of Patent: Feb. 12, 2019

(54) CIRCUIT AND METHOD FOR HIGH-ACCURACY CURRENT SENSING

(71) Applicant: Dialog Semiconductor (UK) Limited, London (GB)

(72) Inventors: Danilo Gerna, Cortaillod (CH); Enrico Pardi, Pisa (IT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/268,817

(22) Filed: Sep. 19, 2016

(65) Prior Publication Data
US 2017/0141676 A1 May 18, 2017

(30) Foreign Application Priority Data
Nov. 16, 2015 (DE) .................. 10 2015 222 570

(51) Int. Cl.
 *G05F 3/08* (2006.01)
 *H02M 1/088* (2006.01)
 (Continued)

(52) U.S. Cl.
 CPC ........ *H02M 1/088* (2013.01); *G01R 19/0092* (2013.01); *H02M 3/158* (2013.01);
 (Continued)

(58) Field of Classification Search
 CPC .... H02M 3/158; H02J 7/0052; H03M 1/0607; G05F 3/262
 (Continued)

(56) References Cited

U.S. PATENT DOCUMENTS

| | | | | |
|---|---|---|---|---|
| 6,255,887 B1 * | 7/2001 | Adams | .................... | G05F 3/262 323/315 |
| 6,424,131 B1 * | 7/2002 | Yamamoto | ......... | H03K 17/0822 323/282 |

(Continued)

FOREIGN PATENT DOCUMENTS

DE  38 55 506  3/1997

OTHER PUBLICATIONS

Co-pending US Patent DS14-048S, U.S. Appl. No. 14/838,266, filed Aug. 27, 2015, "Vds Equalizer Offset Compensation for a Current Sense Circuit," by Danilo Gerna et al., 32 pgs.

(Continued)

*Primary Examiner* — Rajnikant Patel
(74) *Attorney, Agent, or Firm* — Saile Ackerman LLC; Stephen B. Ackerman

(57) ABSTRACT

A circuit for providing a current flowing from a supply voltage into an electric load is presented. The circuit comprises a first circuit branch connected between the supply voltage and an output node connected to the electric load, wherein the first circuit branch comprises a first transistor device, a second circuit branch connected between the supply voltage and a predetermined voltage level, wherein the second circuit branch comprises a series connection of a second transistor device that is a scaled replica of the first transistor device and a current source. The control terminals of the first and second transistor devices are connected to each other. A control circuit is configured to control the voltage at the control terminal of the first transistor device depending on a current flowing through the first transistor device. The application further relates to a method of operating such circuit.

22 Claims, 3 Drawing Sheets

(51) Int. Cl.
*H02M 3/158* (2006.01)
*H03M 1/06* (2006.01)
*G01R 19/00* (2006.01)
*H02J 7/00* (2006.01)
*H02M 1/00* (2006.01)

(52) U.S. Cl.
CPC ......... *H03M 1/0607* (2013.01); *H02J 7/0052* (2013.01); *H02M 2001/0009* (2013.01)

(58) Field of Classification Search
USPC .......... 327/77, 110, 543, 538; 323/222, 259, 323/280–282, 271, 275, 316
See application file for complete search history.

(56) References Cited

U.S. PATENT DOCUMENTS

| | | | | |
|---|---|---|---|---|
| 6,469,917 | B1* | 10/2002 | Ben-Yaakov | H02M 1/4225 323/222 |
| 6,696,821 | B2* | 2/2004 | Haraguchi | H02M 3/156 323/222 |
| 6,778,366 | B2* | 8/2004 | Finney | H01L 29/7813 361/18 |
| 7,183,756 | B1* | 2/2007 | Dikken | G01R 19/0092 323/280 |
| 7,221,208 | B2* | 5/2007 | Kubota | H03K 17/0822 323/312 |
| 7,333,778 | B2* | 2/2008 | Pehlke | H03C 1/06 330/10 |
| 7,659,706 | B2* | 2/2010 | Nishida | H02H 3/087 323/314 |
| 8,232,781 | B2* | 7/2012 | Marino | G01R 19/16552 323/271 |
| 8,238,126 | B2* | 8/2012 | Ruan | H04L 12/10 307/82 |
| 8,917,076 | B2* | 12/2014 | Hsing | G05F 1/56 323/271 |

OTHER PUBLICATIONS

Co-pending US Patent DS14-066S, U.S. Appl. No. 14/864,966, filed Sep. 25, 2016, "Accurate Current Sensing," by Nicolo Nizza et al., 33 pgs.

German Office Action, File Number: 10 2015 222 570.4, Applicant: Dialog Semiconductor (UK) Limited, dated Nov. 24, 2016, 6 pgs, and English language translation, 8 pgs.

German Office Aciton, Reference No. 10 2015 222 570.4, Appliant: Dialog Semiconductor (UK) Limited, dated Oct. 16, 2018, 6 pages, and English language translation, 7 pages.

* cited by examiner

CIRCUIT AND METHOD FOR HIGH-ACCURACY CURRENT SENSING

TECHNICAL FIELD

This application relates to circuits and methods for sensing (or controlling) a current flowing from a supply voltage into an electric load. The application particularly relates to such circuits and methods that allow for accurate and fast sensing (or controlling) of the current in a direct charging architecture.

BACKGROUND

Current sensing is required for a large array of applications, including load current control e.g. for chargers for portable devices. In such applications, it is important to have available a fast and accurate measurement of how much current is flowing into the load, e.g. for a reliable operation and control of a voltage supply. For direct charging architectures, it is common practice to use an external resistor for measuring the charge current flowing into the battery. However, this method requires an additional pin for connecting the external resistor, and its precision crucially depends on the precision of the external resistor. In addition, attention must be paid to the design of the printed circuit board (PCB) for the direct charging architecture, the package, and the input amplifier in order to ensure high precision. Especially for low charge currents, issues of electromagnetic compatibility (EMC) and electromagnetic noise may impair precision of current measurement.

As an alternative to using external resistors, the charge current may be measured by matching a pass device that provides the charge current by a small replica in such a manner that a fraction of the charge current flows through the replica of the pass device. However, especially for small charge currents, precision of the ratio of the current flowing through the pass device and the current flowing through the replica cannot be ensured in conventional direct charging architectures, thus impairing precision of current measurement for small charge currents.

SUMMARY

There is a need for an improved circuit for providing (including sensing and/or controlling) a current flowing from a supply voltage into an electric load, and for an improved method of operating such circuit. There further is a need for a circuit for providing a current flowing from a supply voltage into an electric load that ensures high precision of current sensing or current control even for small currents. In view of this need, the present document proposes a circuit for providing a current flowing from a supply voltage into an electric load and a method of controlling such circuit, having the features of the respective independent claims.

An aspect of the disclosure relates to a circuit for providing a current flowing from a supply voltage into an electric load. The electric load may be a battery, for example. Accordingly, the circuit may be a charging circuit, for example, and said current may be a charge current. The circuit may comprise a first circuit branch connected between the supply voltage and an output node connectable to the electric load. The first circuit branch may comprise a first transistor device (pass transistor). The circuit may further comprise a second circuit branch connected between the supply voltage and a predetermined voltage level. The predetermined voltage level may be the ground voltage level ($V_{SS}$), for example. The second circuit branch may comprise a series connection of a second transistor device (sense transistor) that is a scaled replica of the first transistor device and a current source. The first and second transistor devices may be MOSFETs, such as NMOS or PMOS transistors, for example. For the case of the first and second transistor devices being PMOS transistors, the predetermined voltage level may be lower than the supply voltage. For the case of the first and second transistor devices being NMOS transistors, the predetermined voltage level may be higher than the supply voltage. Control terminals (e.g. gate terminals) of the first and second transistor devices may be connected to each other. The circuit may further comprise a feedback circuit that receives voltages at respective output terminals (e.g. drain terminals) of the first transistor device and the second transistor device as input voltages. Said feedback circuit may be a negative feedback circuit. Said feedback circuit may be configured to perform feedback control to equalize said input voltages. In other words, the feedback circuit may be configured to equalize a first voltage drop across the first transistor device (e.g. the source-drain voltage $V_{DS}$ of the first transistor device) and a second voltage drop across the second transistor device (e.g. the source-drain voltage $V_{DS}$ of the second transistor device), i.e. to substantially nullify a difference between the first and second voltage drops. The feedback circuit may be a $V_{DS}$ equalizer, for example. The circuit may further comprise a control circuit for controlling a voltage (e.g. gate voltage) at the control terminal of the first transistor device. Said control circuit may be configured to control said voltage at the control terminal of the first transistor device based on a quantity indicative of or depending on a current (e.g. charge current) flowing through the first transistor device. Said quantity may relate to the first voltage drop across the first transistor device, or to a control value for setting the current flowing through the first transistor device, for example.

Configured as above, the circuit for providing a current flowing from the supply voltage into the electric load can achieve high precision of current sensing (current control), without requiring the use of external components, such as external resistors. Accordingly, the circuit does not require additional pins for connecting such external components and thus can be simplified. Since the voltage at the control terminal of the first transistor device is controlled based on a quantity indicative of or depending on the current flowing through the first transistor device, high precision of current sensing (or controlling) can be ensured even for very low currents. In particular, by providing such control of the voltage at the control terminal of the first transistor device, the voltage drop (e.g. source-drain voltage $V_{DS}$) across the first transistor device can be prevented from becoming too small, e.g. taking values comparable to any offset of the feedback circuit. By ensuring a sufficiently high voltage drop, said offset of the feedback circuit can be prevented from significantly impacting precision of the feedback circuit, and thus of current sensing (or current control). In addition to ensuring high precision of current sensing, the above configuration also allows the relaxation of the design constraints on the feedback circuit, especially any operational amplifiers included therein.

In embodiments, the control circuit may be configured to control said voltage at the control terminal of the first transistor device based on a quantity indicative of a current generated (e.g. sunk) by the current source. In the above configuration, the current flowing through the first transistor device may be set by the current flowing through the second transistor device, i.e. by the current generated by the current source. Thus, the current generated by the current source offers an indication of the current flowing through the first transistor device, and thus of the first voltage drop across the first transistor device. By controlling the voltage at the control terminal of the first transistor device based on the quantity indicative of the current generated by the current source, fast response of control by the control circuit can be achieved in a particularly simple manner.

In embodiments, the current source may be a controllable (i.e. programmable) current source. The control circuit may be configured to control said voltage at the control terminal of the first transistor device based on a control value for controlling the controllable current source. The control circuit may comprise a digital-to-analog converter (DAC) for converting the control value to a voltage that may be applied to the control terminal of the first transistor device, or used to otherwise control said voltage at the control terminal of the first transistor device. By directly employing the control value for controlling the current source also for controlling the voltage at the control terminal of the first transistor device, the circuit can be implemented with a particularly simple and cost-effective layout.

In embodiments, the control circuit may be configured to control said voltage at the control terminal of the first transistor device based on a voltage difference between a voltage at an input terminal (e.g. source terminal) of the first transistor device and the voltage at the output terminal of the first transistor device (e.g. based on the source drain voltage $V_{DS}$ of the first transistor device). Since said voltage difference offers a direct indication of the relative impact of the offset of the feedback circuit, said offset can be reliably prevented from affecting precision of current sensing (or current control) at a desired level.

In embodiments, the control circuit may be configured to control said voltage at the control terminal of the first transistor device to a first voltage if said voltage difference is above a first threshold voltage, and to a second voltage different from the first voltage if said voltage difference is below the first threshold voltage. The first voltage may correspond to the predetermined voltage level. The second voltage may be chosen such that an on-state resistance (e.g. on-state source-drain resistance) of the first transistor device between its input terminal and output terminal increases when said voltage at the control terminal of the first transistor device changes from the first voltage to the second voltage. The second voltage may be closer to the supply voltage than the first voltage. The second voltage may be higher than the first voltage if the first and second transistor devices are PMOS transistors, and may be lower than the first voltage if the first and second transistor devices are NMOS transistors. Accordingly, the gate-source voltage $V_{GS}$ in case of application of the second voltage to the gate terminal of the first transistor device may be lower than the gate-source voltage $V_{GS}$ in case of application of the first voltage to the gate terminal of the first transistor device.

Accordingly, once the voltage drop across the first transistor device becomes too small to provide for a desired level of precision of current sensing (or current control), the voltage at the control terminal of the first transistor device can be adjusted such that the on-state resistance of the first transistor device is increased and said voltage drop is enhanced. Thereby, precision of current sensing (or current control) can be enhanced, as described above. On the other hand, power efficiency of the circuit is not significantly affected by this measure, since said increase of on-state resistance of the first transistor device occurs for low currents only.

In embodiments, the control circuit may be further configured to control said voltage at the control terminal of the first transistor device to a third voltage different from the first and second voltages if said voltage difference is above a second threshold voltage that is larger than the first threshold voltage. The third voltage may be chosen such that an on-state resistance of the first transistor device between its input terminal and output terminal decreases when said voltage at the control terminal of the first transistor device changes from the first voltage to the third voltage. The third voltage may be farther from the supply voltage than the first voltage. The third voltage may be lower than the first voltage if the first and second transistor devices are PMOS transistors, and may be higher than the first voltage if the first and second transistor devices are NMOS transistors. Accordingly, the gate-source voltage $V_{GS}$ in case of application of the third voltage to the gate terminal of the first transistor device would be higher than the gate-source voltage $V_{GS}$ in case of application of the first voltage to the gate terminal of the first transistor device.

Accordingly, the on-state resistance of the first transistor device may be decreased for high currents, thereby improving power efficiency of the circuit. On the other hand, said decrease of on-state resistance for high currents does not significantly affect precision of current sensing (or current control).

In embodiments, the control circuit may comprise an analog-to-digital converter (ADC) for converting said voltage difference to a digital signal. The ADC may receive said voltage difference as an input at its input ports. The control circuit may further comprise a digital processing circuit for processing the digital signal. The digital processing circuit may be a proportional-integral-derivative (PID) controller. The control circuit may yet further comprise a DAC for converting an output signal of the digital processing circuit to a voltage for application to the control terminal of the first transistor device, or for otherwise controlling said voltage at the control terminal of the first transistor device. Thereby, the control circuit may be implemented in a particularly simple and efficient manner.

In embodiments, the ADC may comprise a first comparator with a first offset. The ADC may further comprise a second comparator with a second offset different from the first offset. The first and/or second offset may be a programmable offset, e.g. generated by a respective programmable voltage source connected to one of the input ports of the first and/or second comparator (e.g. the positive input port). If the ADC comprises the first comparator only, it may be referred to as a 1-bit ADC, whereas if it comprises the first and second comparators, it may be referred to as a 2-bit ADC. Thereby, the ADC may be implemented in a particularly simple and efficient manner.

In embodiments, the feedback circuit may be configured to perform voltage equalization by control of the supply voltage. To this end, the feedback circuit may comprise an operational amplifier receiving said input voltages at its input ports. Said operational amplifier may be an autozero discrete times amplifier. Voltage equalization may be performed by control of a power converter (e.g. a DC-DC converter, such as a buck converter) outputting the supply voltage. Thereby, the feedback circuit may be implemented in a particularly simple and efficient manner.

Another aspect of the disclosure relates to a method of controlling a circuit according to the above aspect. The method may comprise (a) performing feedback control to equalize voltages at respective output terminals of the first transistor device and the second transistor device. The method may further comprise (b) controlling a voltage at the control terminal of the first transistor device based on a quantity indicative of or depending on a current flowing through the first transistor device.

In embodiments, step (b) may involve controlling said voltage at the control terminal of the first transistor device based on a quantity indicative of a current generated (e.g. sunk) by the current source.

In embodiments, the current source may be a controllable (i.e. programmable) current source, and step (b) may involve controlling said voltage at the control terminal of the first transistor device based on a control value (e.g. digital control value) for controlling the controllable current source.

In embodiments, step (b) may involve controlling said voltage at the control terminal of the first transistor device based on a voltage difference between a voltage at an input terminal of the first transistor device and the voltage at the output terminal of the first transistor device.

In embodiments, step (b) may further involve controlling said voltage at the control terminal of the first transistor device to a first voltage if said voltage difference is above a first threshold voltage, and to a second voltage different from the first voltage if said voltage difference is below the first threshold voltage.

In embodiments, step (b) may further involve controlling said voltage at the control terminal of the first transistor device to a third voltage different from the first and second voltages if said voltage difference is above a second threshold voltage that is larger than the first threshold voltage.

It will be appreciated that method steps and apparatus features may be interchanged in many ways. In particular, the details of the disclosed method can be implemented as an apparatus adapted to execute some or all or the steps of the method, and vice versa, as the skilled person will appreciate. In particular, it is understood that methods according to the disclosure relate to methods of operating the circuits according to the above embodiments and variations thereof, and that respective statements made with regard to the circuits likewise apply to the corresponding methods.

BRIEF DESCRIPTION OF THE DRAWINGS

Embodiments of the disclosure are explained below in an exemplary manner with reference to the accompanying drawings, wherein FIG. 1 schematically illustrates an example of a circuit for providing a current flowing from a supply voltage into an electric load, FIG. 2 schematically illustrates an example of a circuit for providing a current flowing from a supply voltage into an electric load according to embodiments of the disclosure, FIG. 3 schematically illustrates another example of a circuit for providing a current flowing from a supply voltage into an electric load according to embodiments of the disclosure, FIG. 4 schematically illustrates another example of a circuit for providing a current flowing from a supply voltage into an electric load according to embodiments of the disclosure, FIG. 5 schematically illustrates a detail of another example of a circuit for providing a current flowing from a supply voltage into an electric load according to embodiments of the disclosure, and FIG. 6 schematically illustrates an example of a current flowing from a supply voltage into an electric load when employing circuits according to embodiments of the disclosure.

DESCRIPTION

Figure 1:
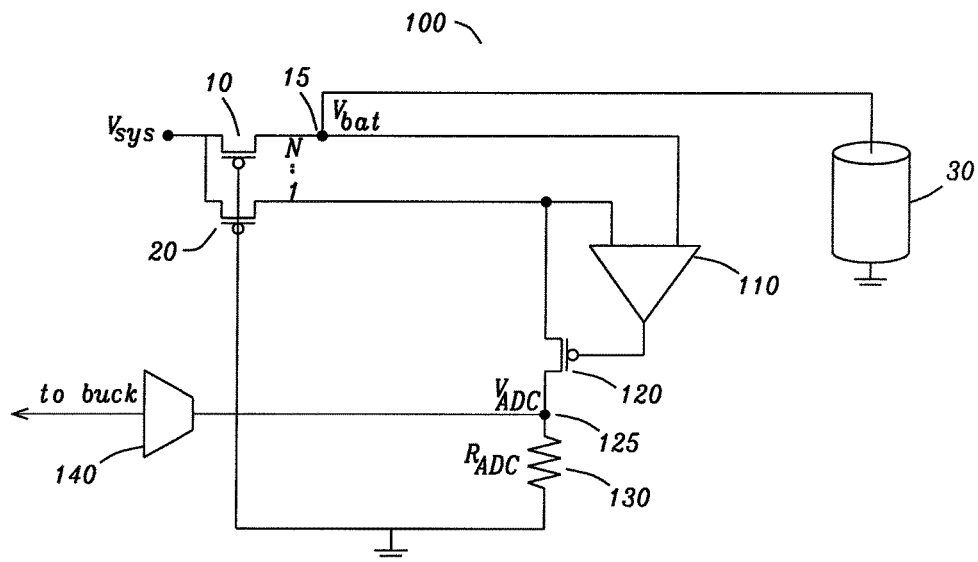

An example for a circuit 100 for providing (including sensing and/or controlling) a current that flows from a supply voltage $V_{sys}$ into an electric load 30 is illustrated in FIG. 1. The supply voltage $V_{sys}$ may be provided by a voltage supply (not shown), such as a DC-DC converter, for example. The voltage supply may be a buck converter comprising a PWM (pulse width modulation) switching unit, an inductance, and a capacitance, but the present disclosure is not limited to the case of the voltage supply being a buck converter, and other implementations of the voltage supply shall be contained within the scope of the present disclosure.

The electric load 30, which may be a battery, such as a battery of a mobile device, for example, may be connected to the supply voltage $V_{sys}$ through a first circuit branch comprising a first transistor device 10 (pass device) and an output node 15 connectable to the electric load 30. A second circuit branch comprising a series connection of a second transistor device 20 (sense device), a third transistor device 120 and a resistive element 130 (e.g. a resistor) may be connected in parallel to the first circuit branch e.g. between the supply voltage $V_{sys}$ and a predetermined voltage level. The first and second transistor devices 10, 20 may be MOSFETs, such as PMOS transistors or NMOS transistors, for example. In the example of FIG. 1, the first and second transistor devices 10, 20 are PMOS transistors. The predetermined voltage level may be at a lower voltage level than the supply voltage $V_{sys}$ if the first and second transistor devices are PMOS transistors, and may be at a higher level than the supply voltage $V_{sys}$ if the first and second transistor devices are NMOS transistors. For example, the predetermined voltage level may correspond to ground ($V_{SS}$).

Control terminals (e.g. gate terminals) of the first and second transistor devices 10, 20 may be connected to each other, i.e. may be kept at a common voltage level. The control terminals may be connected to the predetermined voltage level (e.g. ground). Moreover, the second transistor device 20 may be a (scaled) replica of the first transistor device 10, i.e. the first and second transistor devices 10, 20 may be of the same type but dimensioned differently. In particular, dimensions of the first and second transistor devices 10, 20 may be in a predetermined ratio N:1, with N>1, e.g. N>>1. Then, an on-state resistance $R_2$ (e.g. source-drain resistance in on-state) of the second transistor device 20 may be N times the on-state resistance $R_1$ (e.g. source-drain resistance in on-state) of the first transistor device 10, i.e. $R_2=N \cdot R_1$, and for equal voltage drops (e.g. source-drain voltages $V_{DS}$) across the first and second transistor devices 10, 20, a current $I_2$ (e.g. source-drain current of the second transistor device 20) flowing through the second transistor device 20 may be given by 1/N times the current $I_1$ (e.g. source drain current of the first transistor device 10) flowing through the first transistor device 10, i.e. $I_2=I_1/N$ other words, the current $I_2$ flowing through the second transistor device 20 may be a (predetermined) fraction of the current $I_1$ flowing through the first transistor device 10. The current $I_1$ flowing through the first transistor device 10 may be referred to as a charge current. As indicated above, the first and second transistor devices 10, 20 may be MOSFETs, such as PMOS transistors or NMOS transistors, for example. Also the third transistor device 130 may be a MOSFET, such as a PMOS transistor or an NMOS transistor, for example.

The circuit 100 may further comprise an operational amplifier 110 receiving, at respective input ports, a voltage $V_{bat}$ at the output terminal (e.g. drain terminal) of the first transistor device 10 and a voltage at the output terminal (e.g. drain terminal) of the second transistor device 20. An output port of the operational amplifier 110 may be connected to a control terminal (e.g. gate terminal) of the third transistor device 120. Further, the operational amplifier 110 may be configured to control a voltage at said control terminal of the third transistor device 120 in such a manner that said aforementioned voltages are equalized, i.e. such that the voltage drop across the first transistor device 10 and the voltage drop across the second transistor device 20 are equalized. Thus, the operational amplifier 110 and the third transistor device 120 may be said to provide negative feedback and to form a $V_{DS}$ equalization circuit ($V_{DS}$ equalizer). In other words, the operational amplifier 110 and the third transistor device 120 ensure that the first and second transistor devices 10, 20 are biased with the same voltages, so that the current ratio $I_1/I_2$ is given by N.

A voltage $V_{ADC}$ indicative of the current $I_2$ flowing through the second transistor device 20 may be tapped at an intermediate node 125 arranged between the third transistor device 120 and the resistive element 130. The tapped voltage $V_{ADC}$ may be used, after optional analog-to-digital conversion at an ADC 140, to control the voltage supply (i.e. to control the supply voltage $V_{sys}$). The tapped voltage $V_{ADC}$ may depend on the current $I_2$ flowing through the second transistor device 20 via $V_{ADC}=R_{ADC} \cdot I_2$, where $R_{ADC}$ is the resistance of the resistive element 130. In general, the supply voltage $V_{sys}$ may be said to be controlled in accordance with a quantity indicative of a current flowing through the third transistor device 120. By controlling the supply voltage $V_{sys}$, the current $I_1$ flowing through the first transistor device 10 and into the electric load 30 may be controlled.

For high values of the current $I_1$ flowing through the first transistor device 10, the voltage drop (e.g. $V_{DS}$) across each of the first and second transistor devices 10, 20 is relatively large, and any input offset of the operational amplifier 110 will not affect precision of feedback control by the feedback circuit (e.g. $V_{DS}$ equalization), and hence will not affect precision of the current measurement.

However, for low charge currents the circuit 100 described above suffers from a relatively high current error. The reason is that for low charge currents, the voltage drop (e.g. $V_{DS}$) across each of the first and second transistor devices 10, 20 is relatively small. Namely, for a MOSFET operated in the linear region (i.e. in triode mode or ohmic mode), the source-drain current $I_D$ is approximately given by $$I_D = W/L \cdot \mu \cdot C_{ox} \cdot (V_{GS}-V_{th}) \cdot V_{DS}$$

where W is the gate width, L is the gate length, μ is the charge carrier effective mobility, $C_{ox}$ is the gate oxide capacitance per unit are, $V_{GS}$ is the gate-source voltage, and $V_{th}$ is the threshold voltage. Accordingly, for a given current $I_D$, the source-drain voltage $V_{DS}$ is approximately given by $$V_{DS} = I_D/(W/L \cdot \mu \cdot C_{ox} \cdot (V_{GS}-V_{th})).$$

Then, for a relatively small voltage drop $V_{DS}$ across the first and second transistor devices 10, 20, also the voltage difference between the voltage drops is small and the impact of the input offset of the operational amplifier 110 on the accuracy of $V_{DS}$ equalization among the first and second transistor devices 10, 20 becomes relevant. For relatively poor $V_{DS}$ equalization among the first and second transistor devices 10, 20 (i.e. if there is significant $V_{DS}$ mismatch), the ratio $I_1/I_2$ between the current $I_1$ flowing through the first transistor device 10 and the current $I_2$ flowing through the second transistor device 20 will deviate from the expected value (e.g. N), and accuracy of current sensing (or current control) will be impaired.

Figure 2:
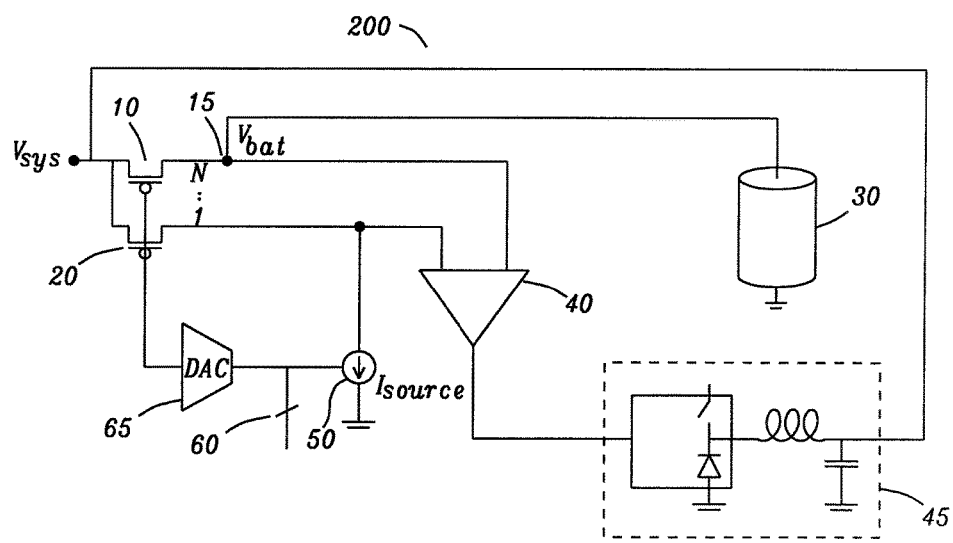

FIG. 2 illustrates an example of a circuit 200 for providing (including sensing and/or controlling) a current that flows from a supply voltage $V_{sys}$ into an electric load 30 according to embodiments of the disclosure. Elements indicated by the same reference signs in FIG. 1 and FIG. 2 are identical. Unless indicated otherwise, respective statements made above with respect to these elements apply also here and in the remainder of the present document.

The supply voltage $V_{sys}$ may be generated by a voltage supply 45, such as a DC-DC converter, for example. The voltage supply 45 may be a buck converter comprising a PWM switching unit, an inductance, and a capacitance, but the present disclosure is not limited to the case of the voltage supply being a buck converter and other implementations of the voltage supply 45 shall be contained within the scope of the present disclosure.

Similar to the circuit 100 described above with reference to FIG. 1, circuit 200 may comprise a first circuit branch and an electric load 30. The circuit 200 may further comprise a second circuit branch connected in parallel to the first circuit branch, e.g. between the supply voltage $V_{sys}$ and the predetermined voltage level. The second circuit branch may comprise a series connection of the second transistor device 20 (sense device) and a current source 50. The current source 50 may be a controllable (i.e. programmable) current source, e.g. an IDAC. A current $I_{source}$ generated (e.g. sunk) by the current source 50 may be controlled by means of a (digital) control value that may be output e.g. by a control logic 60. The control value is an example of a quantity indicative of the current $I_{source}$ generated by the current source 50.

The circuit 200 may further comprise a feedback circuit that receives, as input voltages, the voltage $V_{bat}$ at the output terminal of the first transistor device 10 and the voltage at the output terminal of the second transistor device 20. The feedback circuit may be configured to perform (negative) feedback control to thereby equalize the input voltages, i.e. to equalize the voltage drops across the first and second transistor devices 10, 20. In other words, the feedback circuit may nullify the voltage difference between its input voltages. The feedback circuit may comprise an operational amplifier 40 that receives, at its positive and negative input ports, the aforementioned input voltages. An output of the operational amplifier 40 (i.e. a voltage indicative of a voltage difference between the input voltages) may be fed to the voltage supply 45 for controlling the supply voltage $V_{sys}$ that is output by the voltage supply 45. For example, if the power supply 45 is a buck converter, control of the supply voltage $V_{sys}$ may be performed by means of PWM control of the PWM switching unit of the buck converter, in accordance with the output of the operational amplifier 40. Thereby, the supply voltage $V_{sys}$ may be set to a value that ensures $V_{DS}$ equalization among the first and second transistor devices 10, 20. In other words, the feedback circuit may ensure that the first and second transistor devices 10, 20 are biased with the same voltages, so that the current ratio $I_1/I_2$ has a predetermined value (e.g. N) in accordance with the relative dimensions of the first and second transistor devices 10, 20. The operational amplifier 40 may be provided with means for offset compensation, as described e.g. in co-pending German patent applications 10 2015 204519.6, titled "Accurate Current Sensing" ("Genaue Stromerfassung") and 10 2015 204518.8, titled "VDS equalizer offset compensation for a Current Sense Circuit" ("Offset-Kompensation für einen VDS-Ausgleicher in einer Stromerfassungsschaltung"), which are herewith incorporated by reference in their entirety.

The circuit 200 may further comprise a control circuit for controlling a voltage (e.g. gate voltage) at the control terminal of the first transistor device 10. Since the control terminals of the first and second transistor devices 10, 20 may be connected, i.e. voltages at the control terminals of the first and second transistor devices 10, 20 may be kept at a common voltage level, the control circuit may also control a voltage (e.g. gate voltage) at the control terminal of the second transistor device 20. Accordingly, the control terminals of the first and second transistor devices 10, 20 are not necessarily connected to the predetermined voltage level. The control circuit may be configured to control said voltage in accordance with a quantity indicative of or depending on the current $I_1$ flowing through the first transistor device 10. In the example of FIG. 2, said voltage is controlled in accordance with the (digital) control value for controlling the current source 50 that may be output by the control logic 60. Said control value may be converted to a voltage by means of a DAC 65, and the voltage output by the DAC 65 may be applied to the control terminal of the first transistor device 10, or otherwise used to control the voltage at the control terminal of the first transistor device 10. Since the current $I_2$ flowing through the second transistor device 20 is determined by the control value, and since the current $I_1$ flowing through the first transistor device 10 is a predetermined multiple of the current $I_2$ flowing through the second transistor device 20 (i.e. $I_1=N \cdot I_2$), the control value represents a quantity indicative of the current $I_1$ flowing through the first transistor device 10. The control circuit may comprise the control logic 60 and the DAC 65. Notably, the control value may be used both for setting the current generated by the current source 50 and the voltage at the control terminal of the first transistor device 10.

In embodiments of the disclosure, control of the voltage at the control terminal of the first transistor device 10 by the control circuit may be performed such that said voltage approaches the supply voltage $V_{sys}$ (i.e. is adjusted to a voltage value closer to the supply voltage $V_{sys}$) when the current generated by the current source 50 (and consequently, the current $I_1$ flowing through the first transistor device 10) decreases, and vice versa. That is, for the case of the first transistor device being a PMOS transistor, control of the voltage at the control terminal of the first transistor device 10 by the control circuit may be performed such that said voltage increases (towards the supply voltage) when the current generated by the current source 50 (and consequently, the current $I_1$ flowing through the first transistor device 10) decreases, and vice versa. For the case of the first transistor device being an NMOS transistor, control of the voltage at the control terminal of the first transistor device 10 by the control circuit may be performed such that said voltage decreases (towards the supply voltage) when the current generated by the current source 50 (and consequently, the current $I_1$ flowing through the first transistor device 10) decreases, and vice versa. Thereby, (the absolute value of) the voltage difference ($V_{GS}-V_{th}$) for both the first and second transistor devices 10, 20 is decreased for low currents, and consequently the on-state resistances $R_1$, $R_2$ for both the first and second transistor devices 10, 20 are increased. This results in an increase of the respective voltage drops (e.g. $V_{DS}$) across the first and second transistor devices 10, 20, so that the relative effect of the input offset of the operational amplifier 40 decreases and precision of feedback control by the feedback circuit (e.g. $V_{DS}$ equalization) is improved. As a general guideline, the voltage at the control terminal of the first transistor device 10 may be equal to the predetermined voltage level (e.g. ground) when then the current $I_1$ is equal to the maximum design current of the circuit 200, and should be adjusted to a voltage value closer to the supply voltage for decreasing current $I_1$, i.e. the voltage at the control terminal of the first transistor device 10 should increase for the case of the first transistor device being a PMOS transistor and should decrease for the case of the first transistor device being an NMOS transistor.

Broadly speaking, in the circuit 200, the current source 50 may set the current $I_2$ that flows through the second transistor device 20 (sense device), and consequently also the current $I_1$ that flows through the first transistor device 10 (pass device). The feedback circuit ($V_{DS}$ equalizer) may sense the voltage difference between the output terminals of the first and second transistor devices 10, 20, and its output may be used as an error signal for the power supply 45 (e.g. the buck converter). Depending on the current $I_2$ flowing through the second transistor device 20 (and consequently depending on the current flowing through the first transistor device 10), the voltage at the control terminal of the first transistor device 10 may be set so as to maximize precision of the current $I_1$ flowing through the first transistor device 10. For any value of the voltage at the control terminal of the first transistor device 10, the feedback circuit will ensure that the current ratio $I_1/I_2$ between the current $I_1$ flowing through the first transistor device 10 and the current $I_2$ flowing through the second transistor device 20 is given by the expected value (e.g. N).

Figure 3:
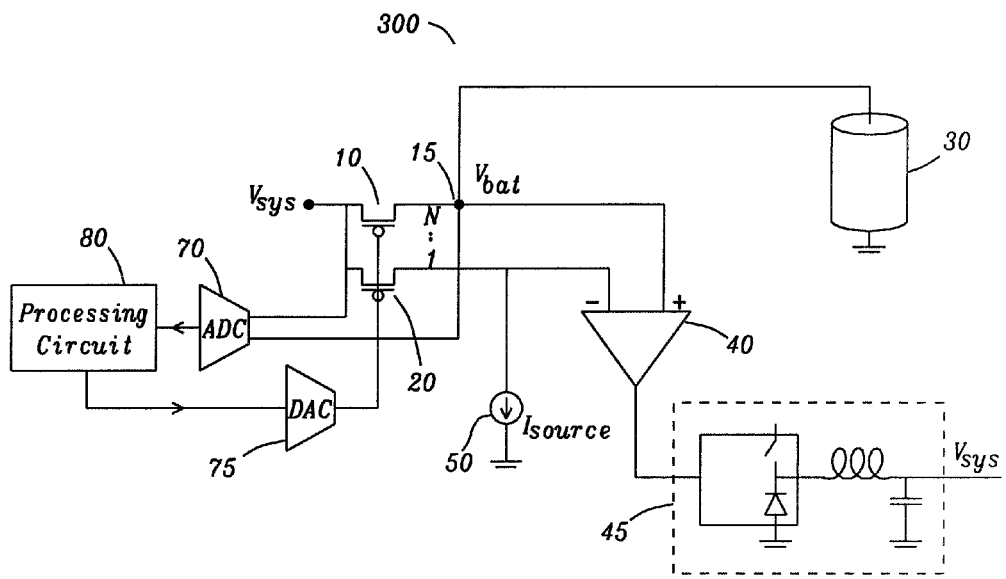

FIG. 3 illustrates another example of a circuit 300 for providing (including sensing and/or controlling) a current that flows from a supply voltage $V_{sys}$ into an electric load 30 according to embodiments of the disclosure.

The circuit 300 differs from the circuit 200 illustrated in FIG. 2 in that the control circuit comprises an ADC 70, a digital processing circuit 80, and a DAC 75. The operational amplifier 40 may be an autozero discrete times amplifier.

The digital processing circuit 80 may be a PID controller. The ADC 70 may receive, as an input, a voltage difference between a voltage at an input terminal (e.g. source terminal) and a voltage at the output terminal (e.g. drain terminal) of the first transistor device 10, and digitize said voltage difference (i.e. convert it to a digital value). The digitized voltage difference may be processed by the digital processing circuit 80. Then, a processing result (i.e. an output of the processing circuit 80) may be converted back to the analog domain by the DAC 75 and may be applied to the control terminal of the first transistor device 10, or otherwise used to control the voltage at the control terminal of the first transistor device 10.

In general, the control circuit may be said to control the voltage at the control terminal of the first transistor device 10 based on (i.e. in accordance with) the voltage difference (or an absolute value thereof) between the voltage at the input terminal and the voltage at the output terminal of the first transistor device 10. Therein, control of said voltage may be performed (e.g. under control of a processing algorithm of the digital processing circuit 80) such that said voltage approaches the supply voltage $V_{sys}$ (i.e. increases if the first transistor device is a PMOS transistor, or decreases if the first transistor device is an NMOS transistor) as the current $I_1$ flowing through the first transistor device 10 decreases (and correspondingly, as said voltage difference decreases). For example, a lower threshold value may be set for said voltage difference. As long as said voltage difference is above said lower threshold, the control terminal of the first transistor device 10 may be connected to the predetermined voltage level. Once the voltage difference drops below the lower threshold value, the voltage at the control terminal of the first transistor device 10 may be adjusted to approach the supply voltage $V_{sys}$ until said voltage difference rises again above the lower threshold value. I.e. the voltage at the control terminal of the first transistor device 10 may be increased if the first transistor device is a PMOS transistor, or may be decreased if the first transistor device is an NMOS transistor In order not to perturb operation of the feedback circuit, the control circuit may correspond to a low-bandwidth control loop, i.e. have a significantly lower bandwidth than the feedback circuit. Moreover, while the control circuit described above may perform processing in the digital domain, the control circuit may also be implemented entirely in the analog domain, as the skilled person will readily appreciate.

Although not shown in FIG. 3, the circuit 300 may also comprise the control logic 60 for setting the current generated by the current source 50. However, this time the control value that is output by the control logic 60 is not used for setting the voltage at the control terminal of the first transistor device 10.

Apart from the above differences, the circuit 300 is identical to the circuit 200 illustrated in FIG. 2 and respective statements made above with respect to FIG. 2 apply also here.

Figure 4:
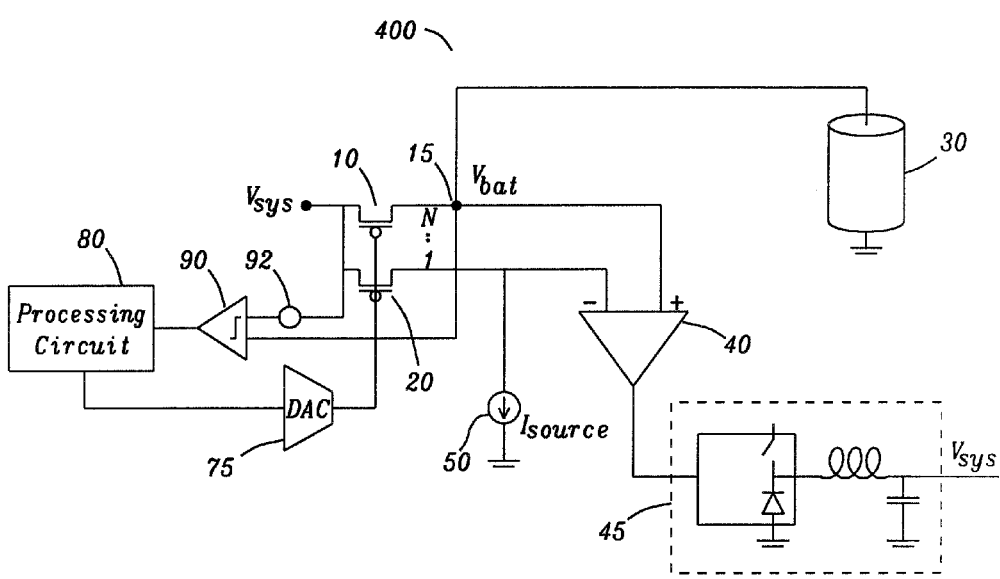

FIG. 4 illustrates another example of a circuit 400 for providing (including sensing and/or controlling) a current that flows from a supply voltage $V_{sys}$ into an electric load 30 according to embodiments of the disclosure.

The circuit 400 differs from the circuit 300 illustrated in FIG. 3 in the implementation of the ADC 70. Namely, in the circuit 400 the ADC 70 may be implemented by a first comparator 90 and a first voltage source 92. The first comparator 90 may be either clocked or continuous time, wherein in the second case, the first comparator 90 may be implemented with a hysteresis function. The first comparator 90 may receive, at its respective input ports, the voltage at the input terminal of the first transistor device 10 and the voltage at the output terminal of the first transistor device 10. The first voltage source 92 may be connected to one of the input ports of the first comparator 90 (e.g. the positive input port), thereby generating a first offset for the first comparator 90. The first voltage source may be a controllable (i.e. programmable) voltage source for generating a variable first offset, i.e. the first comparator 90 may have a variable first offset. Such implemented, the ADC 70 may be referred to as a 1-bit ADC.

The first comparator 90 may output a first signal level if the voltage difference between the voltage at the input terminal of the first transistor device 10 and the voltage at the output terminal of the first transistor device 10 is above a first threshold voltage, and may output a second signal level if said voltage difference is below said first threshold voltage, wherein the first threshold voltage may be determined by the first offset. Moreover, the first threshold voltage may correspond to the above-mentioned lower threshold value. The digital processing circuit 80 may perform processing on the output of the first comparator 90 such that the voltage at the control terminal of the first transistor device 10 is set to a first voltage if said voltage difference is above the first threshold voltage, and to a second voltage different from the first voltage if said voltage difference is below the first threshold value. Therein, the first voltage may correspond to the predetermined voltage level, e.g. ground ($V_{SS}$). Moreover, the second voltage may be chosen such that, when the second voltage is present at the control terminal of the first transistor device 10, the on-state resistance (e.g. source-drain resistance in on-state) of the first transistor device 10 between its input and output terminals is larger than when the first voltage is present at the control terminal of the first transistor device 10. This implies that when the second voltage is present at the control terminal of the first transistor device 10, e.g. ($V_{GS}-V_{th}$) is lower than when the first voltage is present at the control terminal of the first transistor device 10. Accordingly, the second voltage may be higher than the first voltage if the first transistor device is a PMOS transistor, or may be lower than the first voltage if the first transistor device is an NMOS transistor. For example, the second voltage may be between the predetermined voltage level and the supply voltage.

In general, the control circuit may be said to perform the aforementioned control of the voltage at the control terminal of the first transistor device 10.

Apart from the above differences, the circuit 400 is identical to the circuit 300 illustrated in FIG. 3 and respective statements made above with respect to FIG. 3 apply also here.

Figure 5:
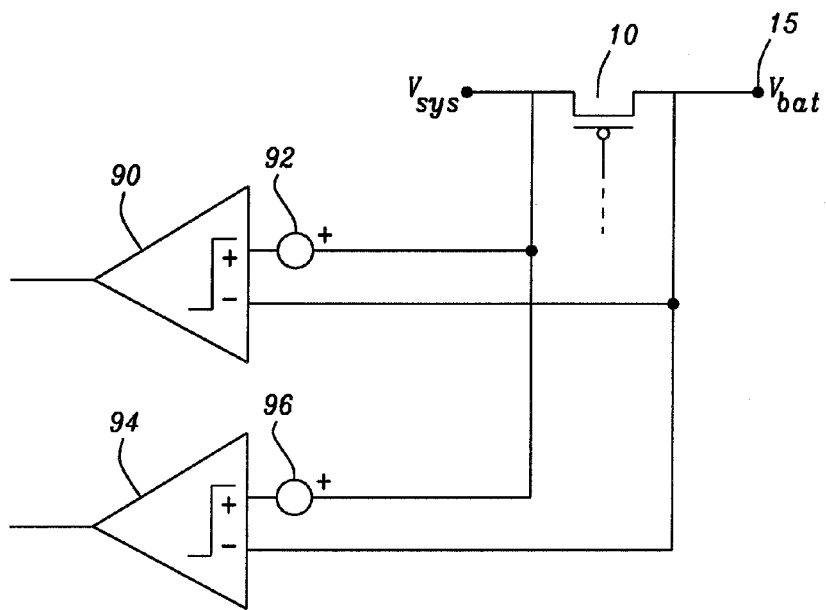

FIG. 5 schematically illustrates a detail of another example of a circuit for providing (including sensing and/or controlling) a current flowing from a supply voltage into an electric load according to embodiments of the disclosure. In particular, FIG. 5 schematically illustrates another implementation of the ADC 70 of the circuit 300 illustrated in FIG. 3.

In addition to the first comparator 90 and first voltage source 92, the implementation of the ADC 70 illustrated in FIG. 5 may comprise a second comparator 94 and a second voltage source 96. Also the second comparator 94 may be either clocked or continuous time, wherein in the second case, the second comparator 94 may be implemented with a hysteresis function. The first and second comparators 90, 94 may be connected in parallel, i.e. also the second comparator 94 may receive, at its respective input ports, the voltage at the input terminal of the first transistor device 10 and the voltage at the output terminal of the first transistor device 10. The second voltage source 96 may be connected to one of the input ports of the second comparator 94 (e.g. the positive input port), thereby generating a second offset for the second comparator 94. The second voltage source may be a controllable (i.e. programmable) voltage source for generating a variable second offset, i.e. the second comparator 94 may have a variable second offset. Such implemented, the ADC 70 may be referred to as a 2-bit ADC.

The second comparator 94 may output a third signal level (which may be the same as the first signal level) if the voltage difference between the voltage at the input terminal of the first transistor device 10 and the voltage at the output terminal of the first transistor device 10 is above a second threshold voltage, and may output a fourth signal level (which may be the same as the second signal level) if said voltage difference is below said second threshold voltage, wherein the second threshold voltage may be determined by the second offset and may be larger than the first threshold voltage. The digital processing circuit 80 may perform processing on the output of the first and second comparators 90, 94 such that the voltage at the control terminal of the first transistor device 10 is set to the first voltage if said voltage difference is above the first threshold voltage and below the second threshold voltage, to the second voltage if said voltage difference is below the first threshold value, and to a third voltage different from the first and second voltages if said voltage difference is above the second threshold voltage. Therein, the third voltage may be chosen such that, when the third voltage is present at the control terminal of the first transistor device 10, the on-state resistance (e.g. source-drain resistance in on-state) of the first transistor device 10 between its input and output terminals is smaller than when the first voltage is present at the control terminal of the first transistor device 10. This implies that when the third voltage is present at the control terminal of the first transistor device 10, e.g. ($V_{GS}$-$V_{th}$) is higher than when the first voltage is present at the control terminal of the first transistor device 10. Accordingly, for the case of the first transistor device being a PMOS transistor, the third voltage may be lower than the first voltage, e.g. below the predetermined voltage level, and for the case of the first transistor device being an NMOS transistor, the third voltage may be higher than the first voltage, e.g. above the predetermined voltage level.

In general, the control circuit may be said to perform the aforementioned control of the voltage at the control terminal of the first transistor device 10.

Figure 6:
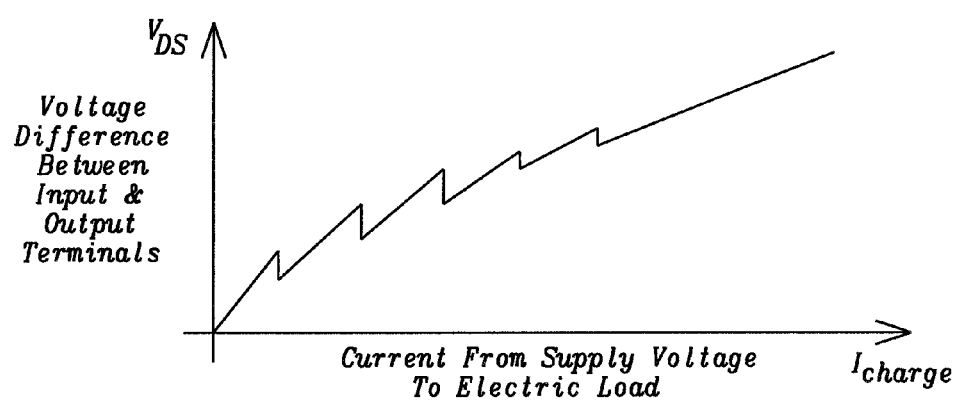

FIG. 6 schematically illustrates an example of a current $I_{charge}$ flowing from a supply voltage into an electric load in dependence on the voltage difference $V_{DS}$ between the input and output terminals of the first transistor device 10 when employing circuits according to embodiments of the disclosure. As can be seen from FIG. 6, the relationship between $I_{charge}$ and $V_{DS}$ may deviate from a linear relationship at least for some range of values of $I_{charge}$, especially for low values of $I_{charge}$.

It should be noted that in the figures described above, the first and second transistor devices are illustrated as PMOS transistors. However, the first and second transistor device may also be NMOS transistors, for example. In this case, the predetermined voltage level would be higher than the supply voltage $V_{sys}$. Moreover, while for the case of the first and second transistor devices being PMOS transistors the voltage at the control terminal of the first transistor device is increased towards the supply voltage $V_{sys}$ as the current $I_1$ flowing through the first transistor device 10 decreases, said voltage at the control terminal of the first transistor device would be decreased towards the supply voltage $V_{sys}$ as the current $I_1$ flowing through the first transistor device 10 decreases for the case of the first and second transistor devices being NMOS transistors. Further adaptations necessitated by replacing the PMOS transistors in the figures by NMOS transistors are understood to be readily apparent to the skilled person and to be contained within the scope of the present disclosure.

It should be further noted that the apparatus features described above correspond to respective method features that may however not be explicitly described, for reasons of conciseness. The disclosure of the present document is considered to extend also to such method features. In particular, the present disclosure is understood to relate to methods of operating the circuits described above.

It should further be noted that the description and drawings merely illustrate the principles of the proposed apparatus. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. A charging circuit for providing a charge current flowing from a supply voltage into an electric load, the circuit comprising:
    a first circuit branch connected between the supply voltage and an output node connectable to the electric load, the first circuit branch comprising a first transistor device;
    a second circuit branch connected between the supply voltage and a predetermined voltage level, the second circuit branch comprising a series connection of a second transistor device that is a scaled replica of the first transistor device and a current source, wherein the current source is connected to an output terminal of a second transistor device, and wherein control terminals of the first and second transistor devices are connected to each other;
    a feedback circuit that receives voltages at respective output terminals of the first transistor device and the second transistor device as input voltages, wherein the feedback circuit is configured to perform feedback control to equalize said input voltages and wherein the feedback circuit is configured to perform voltage equalization by control of the supply voltage; and
    a control circuit for controlling a voltage at the control terminal of the first transistor device, wherein the control circuit is configured to control said voltage at the control terminal of the first transistor device based on a quantity indicative of or depending on a current flowing through the first transistor device.

2. The circuit according to claim 1, wherein the control circuit is configured to control said voltage at the control terminal of the first transistor device based on a quantity indicative of a current generated by the current source.

3. The circuit according to claim 2,
    wherein the current source is a controllable current source; and
    the control circuit is configured to control said voltage at the control terminal of the first transistor device based on a control value for controlling the controllable current source.

4. The circuit according to claim 1, wherein the control circuit is configured to control said voltage at the control terminal of the first transistor device based on a voltage difference between a voltage at an input terminal of the first transistor device and the voltage at the output terminal of the first transistor device.

5. The circuit according to claim 4, wherein the control circuit is configured to control said voltage at the control terminal of the first transistor device to a first voltage if said voltage difference is above a first threshold voltage, and to a second voltage different from the first voltage if said voltage difference is below the first threshold voltage.

6. The circuit according to claim 5, wherein the second voltage is chosen such that an on-state resistance of the first transistor device between its input terminal and output terminal increases when said voltage at the control terminal of the first transistor device changes from the first voltage to the second voltage.

7. The circuit according to claim 5, wherein the control circuit is further configured to control said voltage at the control terminal of the first transistor device to a third voltage different from the first and second voltages if said voltage difference is above a second threshold voltage that is larger than the first threshold voltage.

8. The circuit according to claim 7, wherein the third voltage is chosen such that an on-state resistance of the first transistor device between its input terminal and output terminal decreases when said voltage at the control terminal of the first transistor device changes from the first voltage to the third voltage.

9. The circuit according to 5, wherein the control circuit comprises:
   an analog-to-digital converter, ADC, for converting said voltage difference to a digital signal;
   a digital processing circuit for processing the digital signal; and
   a digital-to-analog converter, DAC, for converting an output signal of the digital processing circuit to a voltage for application to the control terminal of the first transistor device.

10. The circuit according to claim 9, wherein the ADC comprises a first comparator with a first offset.

11. The circuit according to claim 9, wherein the ADC comprises a second comparator with a second offset different from the first offset.

12. A method of controlling a charging circuit for providing a charge current flowing from a supply voltage into an electric load, comprising the steps of:
   providing a first transistor device connected between the supply voltage and an output node connectable to the electric load; and
   providing a series connection of a second transistor device that is a scaled replica of the first transistor device and a current source, connected between the supply voltage and a predetermined voltage level, wherein the current source is connected to an output terminal of the second transistor device, and wherein control terminals of the first and second transistor devices are connected to each other,
   performing feedback control to equalize voltages at respective output terminals of the first transistor device and the second transistor device, wherein voltage equalization is performed by controlling the supply voltage; and
   controlling a voltage at the control terminal of the first transistor device based on a quantity indicative of or depending on a current flowing through the first transistor device.

13. The method according to claim 12, said controlling a voltage involves controlling said voltage at the control terminal of the first transistor device based on a quantity indicative of a current generated by the current source.

14. The method according to claim 13,
   wherein the current source is a controllable current source; and
   said controlling a voltage involves controlling said voltage at the control terminal of the first transistor device based on a control value for controlling the controllable current source.

15. The method according to claim 12, said controlling a voltage involves controlling said voltage at the control terminal of the first transistor device based on a voltage difference between a voltage at an input terminal of the first transistor device and the voltage at the output terminal of the first transistor device.

16. The method according to claim 15, wherein said controlling a voltage further involves controlling said voltage at the control terminal of the first transistor device to a first voltage if said voltage difference is above a first threshold voltage, and to a second voltage different from the first voltage if said voltage difference is below the first threshold voltage.

17. The method according to claim 16, wherein said controlling a voltage further involves controlling said voltage at the control terminal of the first transistor device to a third voltage different from the first and second voltages if said voltage difference is above a second threshold voltage that is larger than the first threshold voltage.

18. The method according to claim 16, wherein the second voltage is chosen such that an on-state resistance of the first transistor device between its input terminal and output terminal increases when said voltage at the control terminal of the first transistor device changes from the first voltage to the second voltage.

19. The method according to claim 17, wherein the third voltage is chosen such that an on-state resistance of the first transistor device between its input terminal and output terminal decreases when said voltage at the control terminal of the first transistor device changes from the first voltage to the third voltage.

20. The method according to 12, wherein the control circuit comprises:
   an analog-to-digital converter, ADC, for converting said voltage difference to a digital signal;
   a digital processing circuit for processing the digital signal; and
   a digital-to-analog converter, DAC, for converting an output signal of the digital processing circuit to a voltage for application to the control terminal of the first transistor device.

21. The method according to claim 20, wherein the ADC comprises a first comparator with a first offset.

22. The method according to claim 20, wherein the ADC comprises a second comparator with a second offset different from the first offset.

* * * * *